MODULAR CIRCUIT FABRICATION

Filed Dec. 28, 1959 3 Sheets-Sheet 1

LEONARD KATZIN
INVENTOR.

BY Morris Spector
Arthur Decker
ATTORNEYS

MODULAR CIRCUIT FABRICATION

Filed Dec. 28, 1959 3 Sheets-Sheet 2

LEONARD KATZIN
INVENTOR.

BY [signature]
[signature]
ATTORNEYS

Nov. 23, 1965 L. KATZIN 3,219,886

MODULAR CIRCUIT FABRICATION

Filed Dec. 28, 1959 3 Sheets-Sheet 3

LEONARD KATZIN
INVENTOR.

BY Morris Spector
Arthur Decker
ATTORNEYS

United States Patent Office 3,219,886 Patented Nov. 23, 1965

3,219,886
MODULAR CIRCUIT FABRICATION

Leonard Katzin, Reseda, Calif., assignor, by mesne assignments, to The Bunker-Ramo Corporation, Stamford, Conn., a corporation of Delaware Filed Dec. 28, 1959, Ser. No. 862,213
5 Claims. (Cl. 317—101)

This invention relates to the fabrication of electronic circuits and more particularly to modular miniaturized structures capable of being interconnected to form the complete circuitry for a complicated electronic apparatus such as a digital computer.

The recent emphasis in the design of extensive electronic apparatus is on automatic or semi-automatic production of modular components of standardized aspect, in order to provide rapid assembly and modification of the apparatus, preferably by relatively untrained personnel, and checkout and repair by simple replacement of components without excessive handling, soldering or unavailability of the apparatus. The use of standard modular components, especially circuit boards (modules) also leads to more economical apparatus occupying less space, having less weight, and involving fewer complications with regard to power requirements, heat dissipation, useful operating life and reliability. Furthermore, such circuit boards are more commensurate, with regard to space requirements and weight with modern miniature electronic components.

It is thus a broad object of this invention to provide a modular construction for electronic circuitry.

It is another object of this invention to provide such a module which is of economical fabrication, small size and light weight, and yet exceptionally rugged, easy to construct, electrically stable and which involves no special handling considerations.

It is a further object of this invention to provide circuit modules capable of interconnecting without the necessity for soldering and fully adaptable to the use of latest techniques for the containment of printed circuitry therein.

It is an additional object of this invention to provide circuit modules capable of being interconnected in parallel planes at minimum spacing distance and also capable of being interconnected at angles so that the completed structure may occupy any available space, however unique in shape.

Another object of this invention is to provide a circuit module, the construction of which is commensurate with the use of the latest electrical components such as leadless, miniature and rectangular, polygonal or circular resistors, capacitors, inductors, semiconductors, etc., and in which the assembled circuit module maintains the integrity of the electrical component. It will be made apparent that the association of the component with the circuit module as suggested herein in no way affects the structural or electrical characteristics of the former nor destroys its identity.

Broadly, the invention herein comprises a circuit structure including modules in the form of wafer assemblies which carry electrical conductors and which in addition may carry electronic circuit components. Means are provided for physically and electrically interconnecting any wafer assembly to at least one other wafer assembly.

More particularly, the invention makes use of wafers formed of an insulating material which may be, e.g., a ceramic material of a thickness approximately equal to that of the aforementioned components. The wafers may each define receptacles which conform in size and shape to a component which is receivable therein thereby assuring that each component will be properly carried by the wafer. Selected portions of the wafer surfaces, including portions extending into the receptacles are coated, as for example by typical printed circuitry techniques to establish selected conductive paths. In addition to the receptacles provided for receiving components, other receptacles may be defined any place within or along the periphery of a wafer for detachably receiving an extremity of a connector which functions to physically and electrically interconnect any wafer to at least one other wafer. By providing such connector receiving receptacles within and along the wafer periphery, interconnected wafers may be associated in substantially parallel or perpendicular relationship. In the preferred form of the invention, the connector makes frictional contact with the wafer in a connector receiving receptacle and with the conductive path therein to provide a secure and stable physical and electrical connection which, however, may be easily and readily broken when desired.

Other features and advantages of the invention will become apparent in the following description of the accompanying drawings in which.

Figure 1:
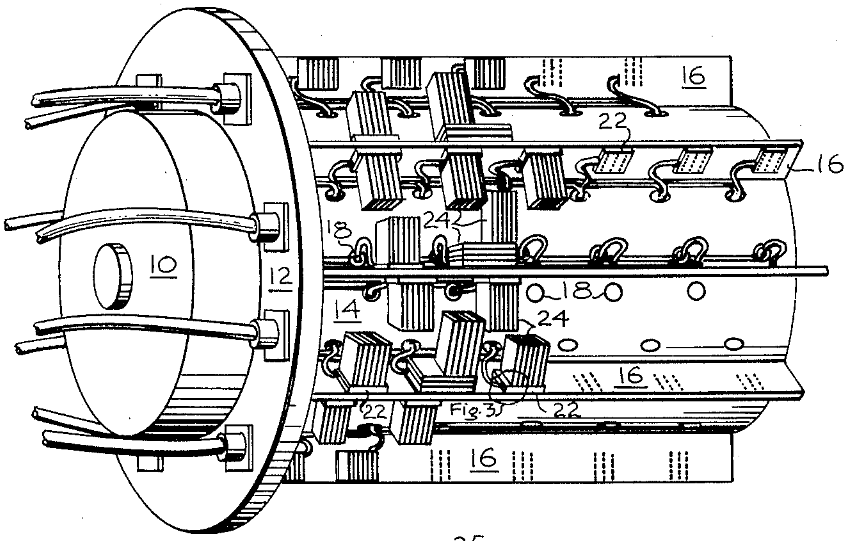
FIGURE 1 is a perspective view of an arrangement of the memory, logic and control portions of a digital computer, particularly illustrating an exemplary usage of the invention.

Referring first to FIGURE 1, here is shown an integral arrangement associating a plurality of circuit wafers according to the invention with a magnetic drum memory to comprise the memory, logic and control for a digital computer. Magnetic drum 10 may be a hollow cylinder approximately four inches in diameter and ten inches long supported by collar 12 to which is attached housing 14. Running along the length of housing 14 and attached thereto as well as to collar 12 are a plurality of supporting walls 16. Walls 16 are spaced from each other around the periphery of housing 14 and are arranged to clear mounting holes 18, which are suitable for retaining electromagnetic heads (not shown) associated with information channels on drum 10. Firmly attached to walls 16 by screws or other removable means are mounting plates 22 to which, as appropriate, are connected the leads from the electromagnetic heads and into which are plugged, in various arrangements as determined by the desired computer circuitry, groups of circuit wafers 24. In an arrangement such as shown here, as many as ten supporting walls 16 are feasible around the periphery of drum 10, each accommodating five mounting plates 22, each of which in turn may support approximately two dozen circuit wafers 24. It is thus seen that considerable circuitry, probably all that is required for the logic and control of a digital computer, may be provided integrally with drum 10 in a volume approximately half again as much as is occupied by drum 10.

Figure 2:
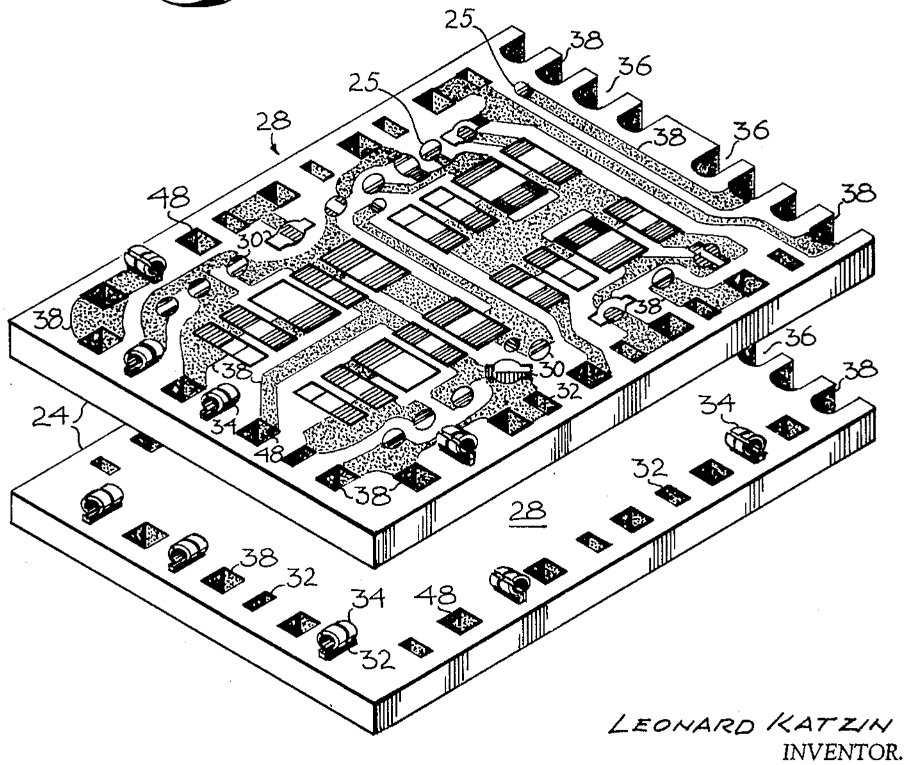
FIGURE 2 is a perspective view of a pair of typical circuit wafers forming a portion of the invention.

FIGURE 2 is an enlarged view of circuit wafers 24 of FIGURE 1, showing a contemplated arrangement of connectors, electronic components and printed circuit wiring for a miniaturized flip-flop, part of a digital computer binary counter. The preferred contemplated thickness of each wafer between the top and bottom surfaces thereof, is 1/16 inch with each of the top and bottom surfaces measuring 1½ by 1 inch in length and breadth. The thickness is determined so as to be suitable to accommodate the electronic components to be described later. All wafers are made up of a number of such basic dimensions to form rectangular geometries 1/16 inch thick. Base 28 is preferably of non-hygroscopic ceramic or glass such as "fotoceram," and is provided with a plurality of receptacles including holes within the base periphery and recesses along the base periphery which serve the following purposes: component holes 30 for the installation of electronic components, connector holes 32 and 48 to respectively accommodate opposite extremities of male connectors 34, and recesses 36 to accommodate male connectors 34 similarly to holes 48. An electrically conductive path is provided within and among the various receptacles in base 28 in accordance with the circuit desired by means of surface wiring, on one or both of the top and bottom surfaces of the wafer, which may be applied by any of the techniques of printed circuitry now known and widely employed. Feed-thru holes 25 interconnect the top and bottom surfaces of the wafer. Connectors and electronic components fit snugly in their respective receptacles in base 28 and, to insure good electrical contact, are soldered into place. Thus, a defective component may be easily replaced without affecting the circuit wafer.

Figures 3, 4:
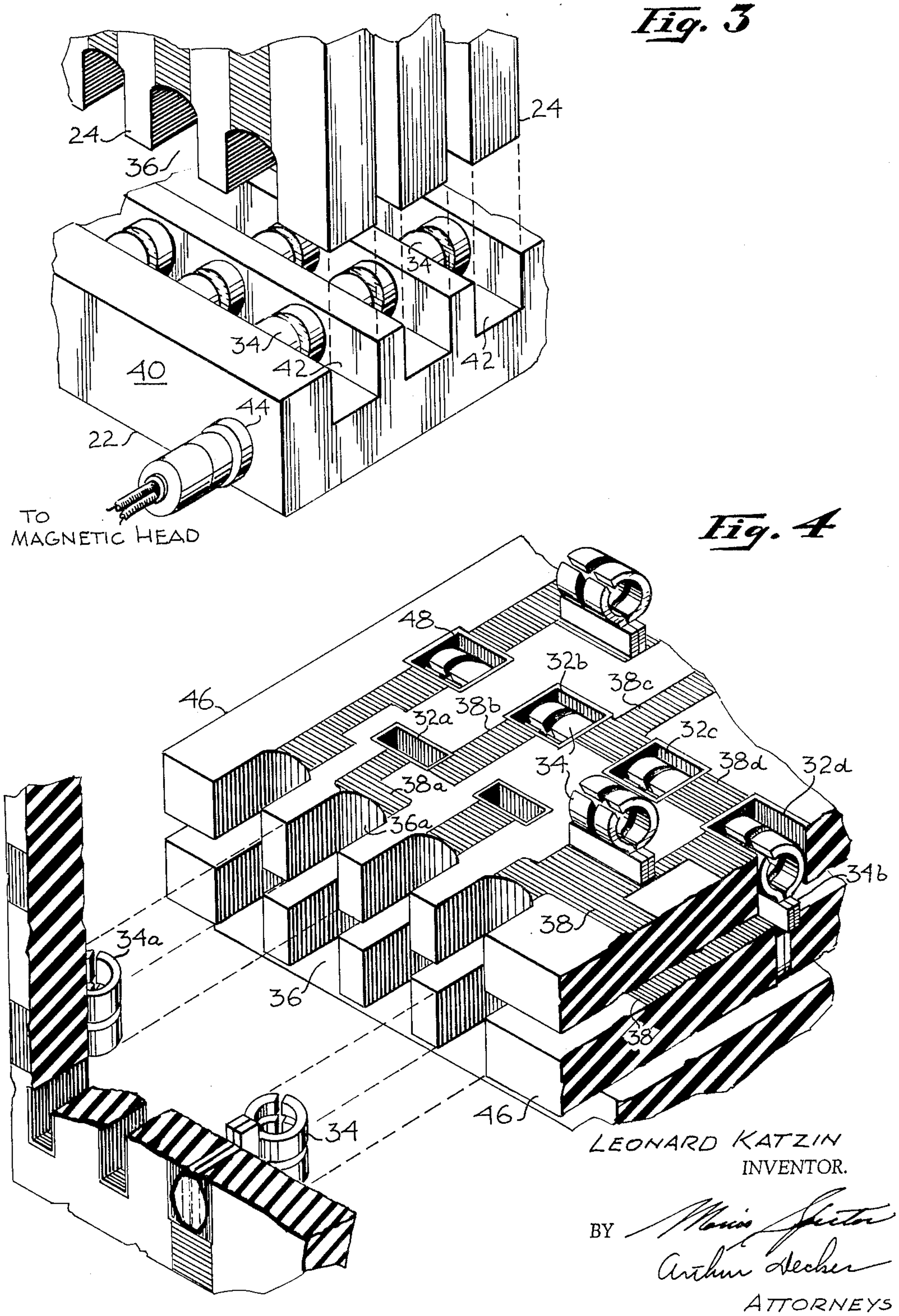
FIGURE 3 is a fragmentary perspective view of a typical circuit wafer and a mounting plate illustrating the manner in which they may be physically and electrically connected.
FIGURE 4 is a fragmentary perspective view of the corner of several stacked circuit wafers showing their association with a mounting plate.

FIGURE 3 indicates the right angle attachment of circuit wafers to a mounting plate mounted on a supporting wall in the structure of FIGURE 1. It is seen that mounting plate 22 comprises base 40, which may be of material similar to base 28 of circuit wafer 24, having a series of slots 42 of sufficient depth and width to accommodate connectors 34 in holes at the base of slots 42. Connection between connectors 34 and a magnetic head (FIGURE 1) is preferably provided by a miniature plug and jack 44 and printed wiring (not shown) on the lower surface of plate 22. As shown, circuit wafers 24 are attached to mounting plate 22 through engagement of recesses 36 of the former with connectors 34 of the latter. The portions of base 40 constituting walls on either side of slots 42 aid in the support of the wafers 24. It should be appreciated that wafers 24 may be interconnected directly to each other if desired.

In FIGURE 4 is shown how wafers may be arranged as a substitute for interwiring of other components or assemblies in an equipment. A plurality of wafers 46, similar in fabrication to circuit wafers 24 (FIGURE 2), are provided with male connectors 34, holes 48, recesses 36 and printed wiring 38, and when associated in a predetermined fashion, form the desired interassembly connections. It can be seen, for instance, that, when the wafers of FIGURE 4 are attached, connection is made from connector 34*a*, to connector 34*b* by printed wiring 38*a* through 38*d*, recess 36*a*, and holes 32*a* through 32*d*.

Figure 5:
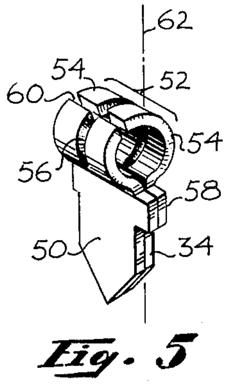
FIGURE 5 is an enlarged perspective view of an embodiment of a male connector for use with the circuit wafer.

Turning now to FIGURE 5, here is shown one embodiment of male connector 34, fabricated from a single piece of high conductivity metal (stamping from a large sheet is suitable), plated or solid as desired, and folded to provide a double section topped by a looped portion. Base 50 of connector 34 is preferably pointed for easy insertion and is dimensioned for snug insertion and firm retention in holes 32 in wafer 24 (FIGURE 2). Looped portion 52 may be circular or elliptical, and preferably is slightly larger in outside diameter than holes 48. In order to assure low resistance contact, looped portion 52 is bifurcated by lateral split 56 into a pair of looped sections 54. Also, in order to assure contact with at least one surface of hole 48 or recess 36 (FIGURE 2), looped portion 52 is further divided by longitudinal split 60 at an off-center position, as indicated by center line 62. Because the looped portion 52 is slightly larger in outside diameter than the hole 48, the contact sections of the portion 52 on either side of split 60 are urged toward each other by the wafer when placed in a hole 48. The resiliency of the connector in turn urges the contact sections away from each other into good frictional contact with the printed wiring 38 in hole 48. To maintain a constant spaced separation between circuit wafers 24 when the latter are attached in parallel planes, connector 34 contains shoulders 58 which are not inserted into holes 32 but rest with their upper and lower edges contacting the surfaces of adjacent wafers. By establishing such a constant spacing between wafers, the wafers function as radiation fins assuring good heat dissipation. After insertion into their receptacles, the pointed ends of connector 34 are spread apart and bent over parallel to the wafer and soldered into place. It is obvious that one pointed end of connector 34 can be made slightly shorter than the other to facilitate handling when spreading the ends apart, and it is further obvious that connectors 34 may be fabricated in a long strip comprising a plurality thereof attached together at shoulders 58 and from which one or as many as desired may be broken.

Figure 6:
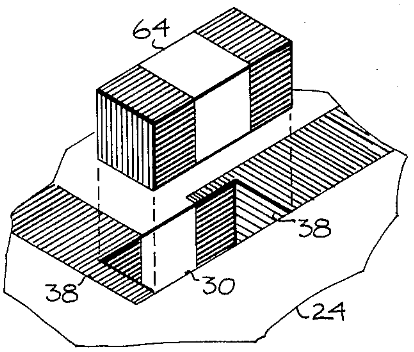
FIGURES 6, 7, 8 and 9 are perspective views of typical miniaturized electric components, namely, resistor, transistor, diode and capacitor, respectively, suitable for use with the circuit wafer of the invention.
Figure 7:
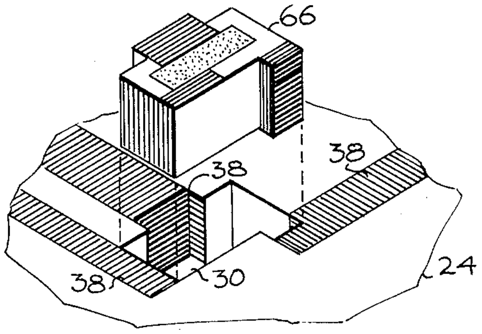
Figure 8:
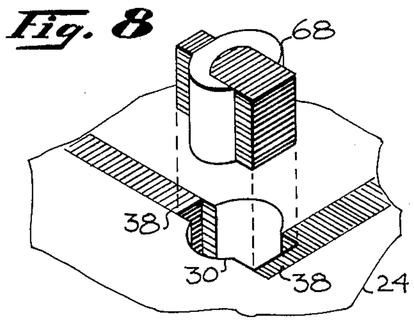
Figure 9:
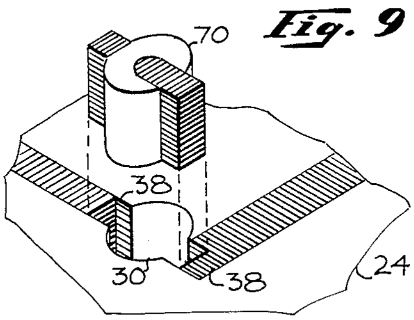

In FIGURES 6 through 9 are illustrated some of the typical miniaturized electronic components contemplated by the wafer structure and interconnecting system of this invention. FIGURE 6 shows a resistor 64; FIGURE 7 shows a transistor 66; FIGURE 8 shows a diode 68; and FIGURE 9 shows a capacitor 70. They are seen to be leadless components having exposed conductive areas, generally of rectangular cross-section, and capable of being inserted and soldered into component holes 30 in order to make connection to printed wiring 38 on circuit wafers 24.

Although exemplary wafer dimensions have been set forth, it is to be understood that these dimensions are not necessarily optimum for all applications of the invention and that the dimensions may be varied without departing from the scope of the invention, so as to provide optimum performance in particular instances. It is further stressed that although in most applications of the invention, each of the plurality of wafers used will be identical in size and shape so as to enable the formation of a compact rectangular solid, it is contemplated that the size and shape of the various wafers could be different to permit the formation of a composite solid of unique configuration if desired.

It can be appreciated that a preferred form of this invention has been described with a degree of particularity. It is to be understood, however, that this form and description are not to be construed as limitations, since the invention may be practiced otherwise within the scope of the following claims.

What is claimed is:

1. An electronic circuit structure comprising a plurality of insulative wafers; each of said wafers having a top, bottom, and peripheral surface and defining receptacles extending therethrough between said top and bottom surfaces, conductive paths established on at least one of said surfaces and extending into said receptacles, circuit components disposed within said receptacles between said top and bottom surfaces and in frictional electrical contact with said conductive paths within said receptacles, and means electrically and physically interconnecting each of said wafers to at least one other wafer at selected points thereon, said means comprising an integral electrically conductive connector having first and second end portions and in intermediate shoulder portion means permanently securing said first end portion in a receptacle in a first and said interconnected wafers and in electrical contact with said conductive path therein, said second portion including a pair of opposed outwardly urged contacts disposed in a receptacle in a second of said interconnected wafers and in frictional and electrical contact with said conductive path therein, said shoulder portion spacing said first and second wafers from one another.

2. The combination of claim 1 wherein said second wafer receptacles are defined along the peripheral surface of said second wafer and said first and second wafers are connected perpendicular to one another.

3. The combination of claim 1 wherein said second wafer receptacles are defined within the periphery of said second wafer and said first and second wafers are connected substantially parallel to one another.

4. The combination of claim 1 wherein each of said circuit components defines a particular peripheral outline indicative of its electrical characteristic and each of said receptacles is of a shape corresponding to the component to be received therein thereby assuring that the proper component is properly placed in each receptacle.

5. An electronic circuit structure comprising a plurality of insulative wafers carrying electrically connected circuit components: each of said wafers having a top, bottom, and peripheral surface and defining receptacles extending therethrough between said top and bottom surfaces, conductive paths established on at least one of said surfaces and extending into said receptacles, and means electrically and physically interconnecting each of said wafers to at least one other wafer at selected points thereon, said means comprising an integral electrically conductive connector having first and second end portions and an intermediate shoulder portion, means permanently securing said first end portion in a receptacle in a first of said interconnected wafers and in electrical contact with said conductive path therein, said second portion including a pair of opposed outwardly urged contacts disposed in a retceptacle in a second of said interconnected wafers and in frictional and electrical contact with said conductive path therein, said shoulder portion spacing said first and second wafers from one another.

References Cited by the Examiner

UNITED STATES PATENTS

| | | | |
|---|---|---|---|
| 2,752,580 | 6/1956 | Shewmaker | 339—17 |
| 2,777,039 | 1/1957 | Thias | 317—101 |
| 2,850,681 | 9/1958 | Horton | 317—101 |
| 2,872,664 | 2/1959 | Minot | 317—101 |
| 2,902,628 | 9/1959 | Leno | 317—101 |
| 2,913,632 | 11/1959 | Stanton | 317—101 |
| 3,071,843 | 1/1963 | Horton | 339—17 |

JOHN F. BURNS, *Primary Examiner.*

SAMUEL BERNSTEIN, DARRELL L. CLAY, *Examiners.*

UNITED STATES PATENT OFFICE
CERTIFICATE OF CORRECTION

Patent No. 3,219,886 November 23, 1965

Leonard Katzin

It is hereby certified that error appears in the above numbered patent requiring correction and that the said Letters Patent should read as corrected below.

Column 4, line 67, for "and", first occurrence, read -- of --.

Signed and sealed this 19th day of September 1967.

(SEAL)
Attest:

ERNEST W. SWIDER
Attesting Officer

EDWARD J. BRENNER
Commissioner of Patents